United States Patent [19]
Yu

[11] Patent Number: 5,998,278
[45] Date of Patent: Dec. 7, 1999

[54] METHOD OF FABRICATING SHALLOW TRENCH ISOLATION STRUCTURES USING A OXIDIZED POLYSILICON TRENCH MASK

[75] Inventor: Simon Yeou-Chong Yu, Tu-Cheng, Taiwan

[73] Assignee: United Integrated Circuits Corp., Hsin-Chu, Taiwan

[21] Appl. No.: 09/056,230

[22] Filed: Apr. 7, 1998

[30] Foreign Application Priority Data

Feb. 13, 1998 [TW] Taiwan .................................. 87102009

[51] Int. Cl.⁶ .................................................. H01L 21/76
[52] U.S. Cl. .......................... 438/424; 438/430; 438/431; 438/FOR 227
[58] Field of Search .................... 438/430, 431, 438/424, FOR 227

[56] References Cited

U.S. PATENT DOCUMENTS 5,930,645  7/1999  Lyons et al. .

FOREIGN PATENT DOCUMENTS 2317087  10/1973  Germany .

Primary Examiner—Richard Booth
Assistant Examiner—Ron Pompey
Attorney, Agent, or Firm—Christie, Parker & Hale, LLP

[57] ABSTRACT

A method of fabricating shallow trench isolation structures. A substrate over which a polysilicon layer and a masking layer are formed is provided. An opening is formed within the polysilicon layer and the masking layer. A trench is then formed within the substrate. An oxide layer is formed within the trench, and the surface of the oxide layer has a same level as the surface of the masking layer. The masking layer is removed and a thermal process is performed to transform the polysilicon layer to a silicon oxide layer. The silicon oxide layer is removed by an wet etching process and a shallow trench isolation structure is accomplished.

12 Claims, 5 Drawing Sheets

METHOD OF FABRICATING SHALLOW TRENCH ISOLATION STRUCTURES USING A OXIDIZED POLYSILICON TRENCH MASK

CROSS-REFERENCE TO RELATED APPLICATION

This application claims priority benefit of Taiwan application Ser. No. 87102009, filed Feb. 13, 1998, the full disclosure of which is incorporated herein by reference.

BACKGROUND OF THE INVENTION

1. Field of the Invention

The invention relates to a method of fabricating device isolation structures, and more particularly to a method of fabricating shallow trench isolation structures.

2. Description of the Related Art

A variety of integrated circuits incorporate device isolation structures between adjacent semiconductor transistors to prevent short circuits between the adjacent transistors. An insulating layer for isolating devices needs to be formed between adjacent transistors. This can be done by forming a shallow trench isolation structure, that define the active areas of devices.

FIGS. 1A–1E schematically illustrate processing steps in the conventional method of forming a trench isolation structure. Referring to FIG. 1A, a substrate 10 having a pad oxide layer 11 formed thereon by thermal oxidation is provided. The pad oxide layer 11, for example, a silicon oxide layer is covered with a silicon nitride layer 12 deposited by plasma enhanced chemical vapor deposition (PECVD).

Referring to FIG. 1B, the silicon nitride layer 12 is covered with a layer of photoresist 13, and defined by conventional photolithography. The silicon nitride layer 12 is anisotropically etched to expose the surface of the pad oxide layer 11. Similarly, the pad oxide layer 11 and the substrate 10 are defined and etched through. The pad oxide layer 11 is penetrated through and a portion of the substrate 10 is removed. Thus a trench 14 is formed in the substrate 10.

Next, the photoresist 13 is stripped to expose the defined silicon nitride layer 12a. The trench 14 within the substrate 10 is covered with a liner oxide layer 16 grown by thermal oxidation at a high temperature, as shown in FIG. 1C. The trench 14 is overfilled with a layer of silicon oxide 15 so that the silicon oxide layer 15 extends over the surface of the silicon nitride layer 12a. Using the silicon nitride layer 12a as a stop layer, chemical mechanical polishing is performed to etch back the silicon oxide layer 15 until the surface of the silicon nitride layer 12a is exposed. Thus an oxide plug 15a structure is formed as show in FIG. 1D.

Referring to FIG. 1E, both the silicon nitride layer 12a and the pad oxide layer 11a are removed, respectively. The pad oxide layer 11a is etched by wet etching, for example, dipping the pad oxide layer in a hydrogen fluoride solution. The isolation structure of the device is accomplished.

In the process as described above, wet etching is used to remove the pad oxide layer 11 a with hydrofluoric acid solution as an etchant. During isotropic etching, the surface of the oxide plug 15a adjacent the substrate 10 is overetched due to the isotropic etching by the hydrofluoric acid. A recess 17 is thus produced on the sidewall of the trench.

Additionally, a sacrificial oxide layer used to protect the surface of the substrate typically is formed over the surface of the substrate after forming the device isolation region. The sacrificial oxide layer is removed by hydrofluoric acid solution and overetching may still cause a recess on the oxide plug adjacent to the surface of the substrate correspondingly.

When the semiconductor device is completed, the charges caused by overetching accumulating in the recess formed on the oxide layer adjacent to the substrate, reduces the threshold voltage of the transistor and produces the abnormal sub-threshold current associated with the "kink effect". Occurrence of the kink effect impairs device and circuit performance and is thus undesirable.

SUMMARY OF THE INVENTION

It is accordingly an object of the present invention to provide a polysilicon layer before forming a masking layer. The polysilicon layer is oxidized to become an silicon oxide layer after etch back. An even surface of the substrate without a recess is obtained. Therefore the kink effect is prevented, and the reliability of the devices is enhanced.

To achieve these objects and advantages, and in accordance with the purpose of the invention, as embodied and broadly described herein, the invention is directed towards a method of fabricating shallow trench isolation structures. A substrate over which a polysilicon layer and a masking layer are formed is provided. The polysilicon layer and the masking layer are formed with an opening. A trench is formed within the substrate. An oxide layer is formed within the trench, and surface of the oxide layer has a same level as the surface of the masking layer. The masking layer is removed and a thermal process is performed to transform the polysilicon layer to a silicon oxide layer. The silicon oxide layer is removed by an wet etching process and a shallow trench isolation is accomplished.

DESCRIPTION OF THE PREFERRED EMBODIMENTS

A preferred embodiment of the present invention is described in detail with reference to FIGS. 2A–2G.

Figure 1A:
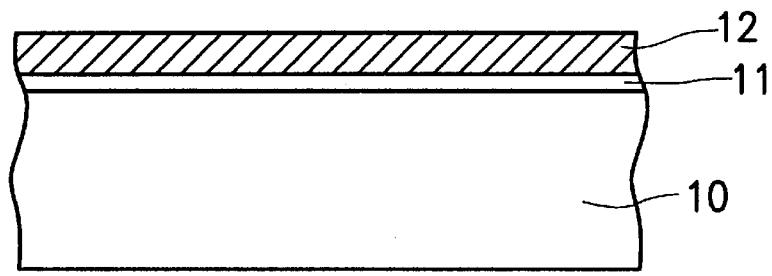
FIGS. 1A–1E schematically illustrate processing steps in the conventional formation of a shallow trench isolation structure.
Figure 1B:
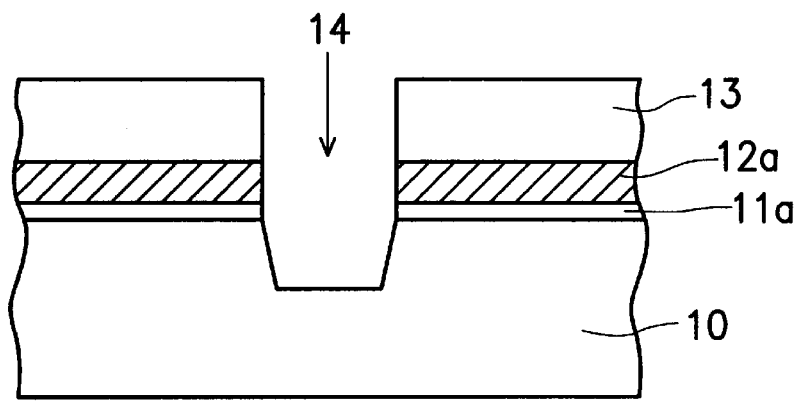
Figure 1C:
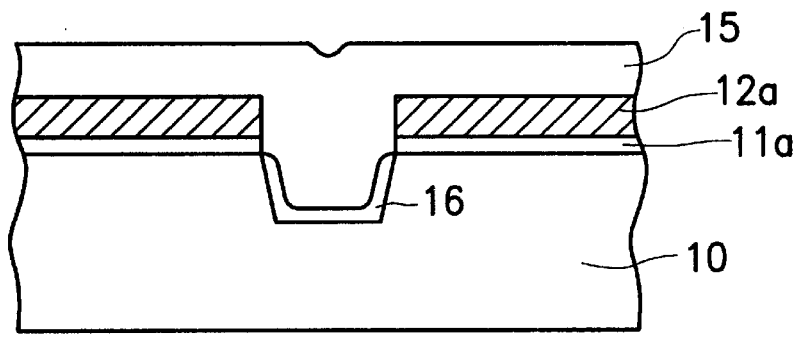
Figure 1D:
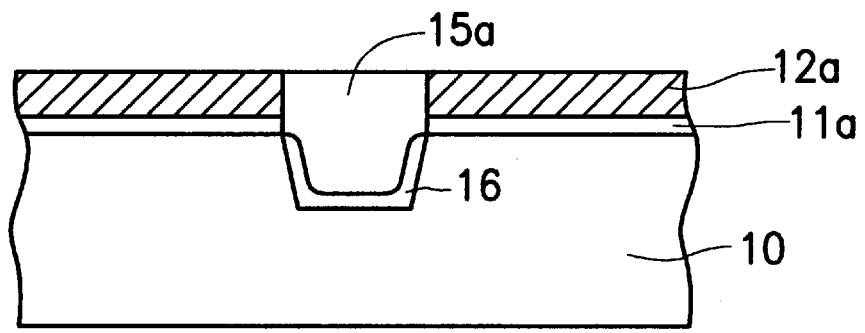
Figure 1E:
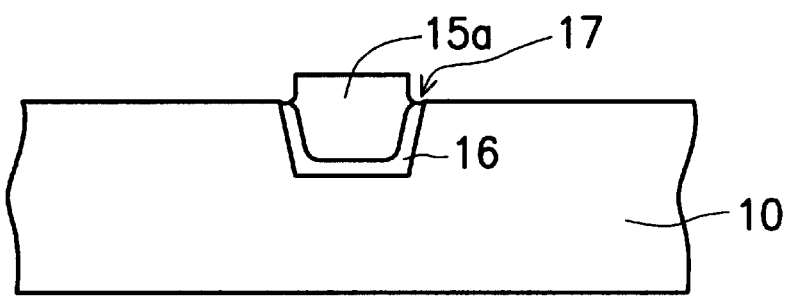
Figure 2A:
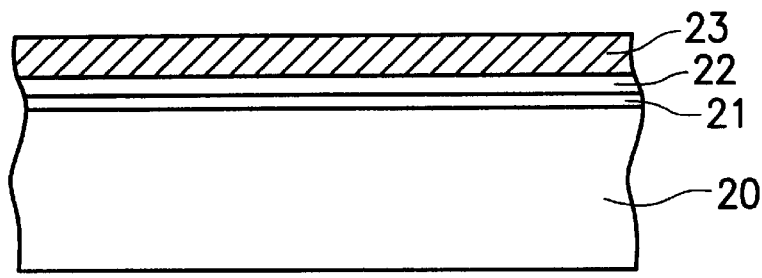
FIGS. 2A–2G schematically illustrate processing steps in the formation of shallow trench isolation in accordance with preferred embodiments of the present invention.
Figure 2B:
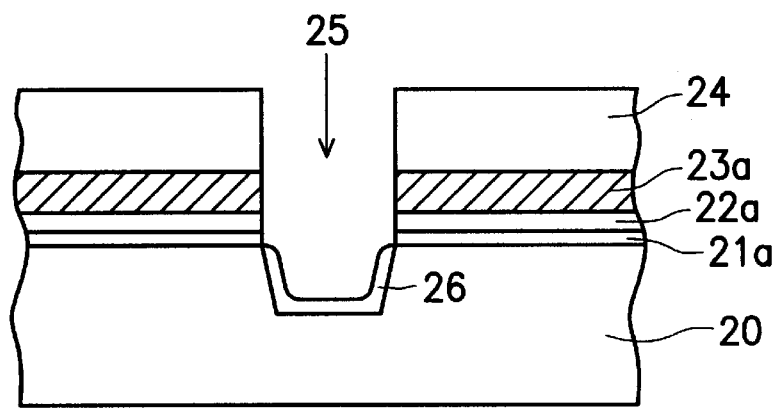

Referring to FIG. 2A, a substrate 20 is provided, and a pad oxide layer 21 with a thickness of 90–300 Å, such as silicon oxide, is thermally formed on the substrate 20. Then a polysilicon layer 22 and a masking layer 23 are formed over the pad oxide layer 21 by chemical vapor deposition (CVD), respectively. The masking layer 23 includes a silicon nitride layer to a thickness of 1000–3000 Å.

Next, the pad oxide layer 21, the polysilicon layer 22 and the masking layer 23 are defined and etched anisotropically by providing a photoresist 24 on the masking layer 23, and an opening (not shown) is formed to expose the substrate 20. A trench 25 is formed by etching the exposed substrate 20. Optionally, a thin oxide layer 26 as a liner oxide layer is grown on the sidewall and the bottom of the trench to remove defects created by the etching process. If the thin oxide layer 26 having a thickness of 200–500 Å is formed, the liner oxide layer 26 can either be left in place, become part of the trench plug, or removed.

Figure 2C:
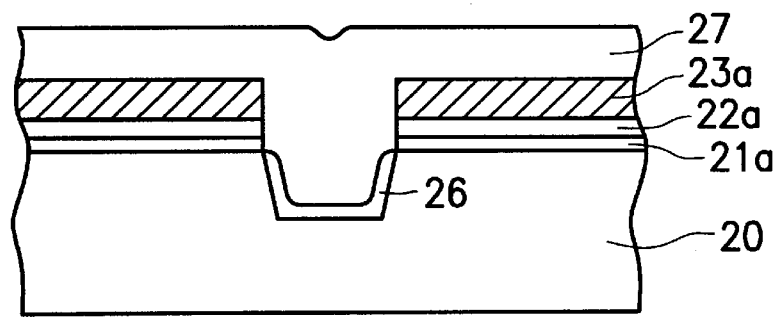

Referring to FIG. 2C, an oxide layer 27 is then deposited over the substrate 20, preferably to overfill the trench region 25 and extend over the surface of the masking layer 23a. A thick oxide layer 27 is deposited, for example, using atmospheric pressure CVD (APCVD) to a thickness of 6000 Å approximately. The thin oxide layer 27 is densified at a higher temperature later. Because the oxide layer shrinks during densification, it is preferred to overfill the trench with the oxide layer. The oxide layer is densified at a temperature of approximately 1000° C. for a period of between 10 to 30 minutes. Deposition of the thick oxide layer 27 might also be achieved by high density plasma CVD (HDPCVD) with higher density and quality and without densification in the subsequent process.

Figure 2D:
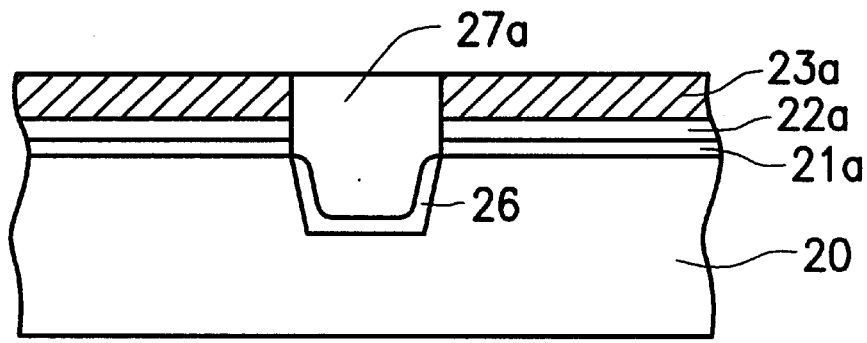

Referring to FIG. 2D, the oxide layer 27 is planarized by a chemical mechanical polish process to remove the excess oxide layer 27 until exposing the masking layer 23a. The masking layer includes a silicon nitride layer or a similar hard material used as a stop layer for CMP. The silicon nitride layer with a thickness of 1000 Å and 3000 Å is preferred because of its applicability and durability.

Figure 2E:
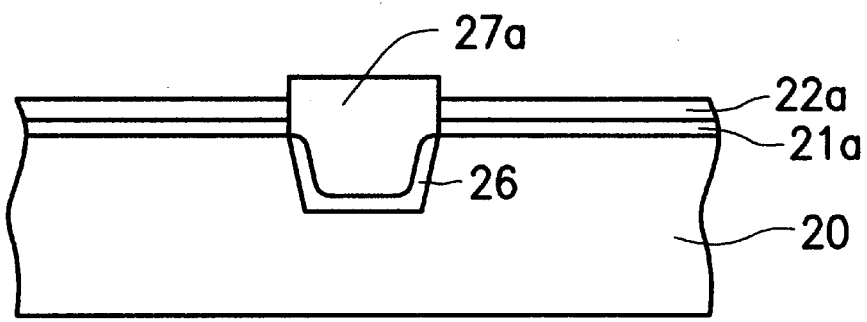
Figure 2F:
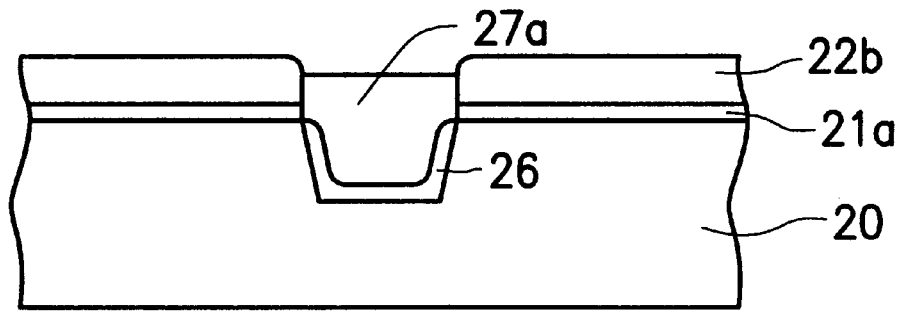

As shown in FIG. 2E, the masking layer 23a is stripped, for example, by wet etching in hot phosphoric acid at a temperature of 150–180° C., or using a plasma etching with a suitable etchant gas, including $SF_6$, He and $O_2$. The surface of the oxide layer 27a is slightly higher than the surface of the polysilicon layer 22a when the masking layer is removed. Next, the polysilicon layer 22a is oxidized by a thermal process and a silicon oxide layer 22b is formed. Thus the surface of the silicon oxide layer 22b formed by heating the substrate 20 is at the same height with or higher than the surface of the oxide layer 27a, as shown in FIG. 2F.

Figure 2G:
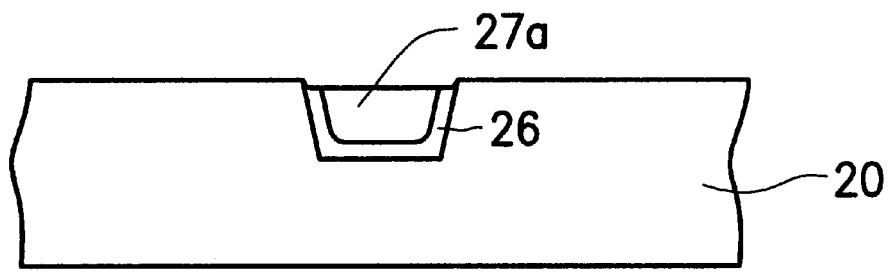

Referring to FIG. 2G, the silicon oxide layer 22b and the pad oxide layer 21a are both etched by wet etching with HF solution. Because the surface of the silicon oxide layer 22b is at the same height with or higher than the surface of the oxide layer 27a that due to the polysilicon layer 22a is transformed to the silicon oxide layer 22b. The total thickness of the oxide layer increases to avoid the oxide layer overetched. The recess between the substrate 20 and the oxide layer 27a is prevented, thus a more even surface for the substrate 20 is provided.

By forming a shallow trench isolation in accordance with the present invention as described above, a polysilicon layer is provided before forming a masking layer, and the polysilicon layer is transformed to an oxide layer by oxidization after the process of etch back. An even surface of the substrate without recess is provided, thus the kink effect is prevented and the reliability of the devices is enhanced.

Other embodiment of the invention will appear to those skilled in the art from consideration of the specification and practice of the invention disclosed herein. It is intended that the specification and examples to be considered as exemplary only, with a true scope and spirit of the invention being indicated by the following claims.

What is claimed is:

1. A method of fabricating shallow trench isolation structures, comprising:

providing a substrate;

forming a polysilicon layer and a masking layer over the substrate, the polysilicon layer and the masking layer having an opening;

forming a trench within the substrate;

forming an oxide layer within the trench, a surface of the oxide layer having a same level as a surface of the masking layer;

removing the masking layer;

transferring the polysilicon layer to a silicon oxide layer by performing a thermal process; and removing the silicon oxide layer.

2. The method according to claim 1, wherein after providing the substrate and before forming the polysilicon layer and the masking layer, further comprises forming a pad oxide layer over the substrate.

3. The method according to claim 2, wherein the pad oxide layer is formed by a thermal process.

4. The method according to claim 1, wherein after defining the trench and before forming the oxide layer further comprises, forming a liner oxide layer on the surface of the trench by thermal oxidation.

5. The method according to claim 1, wherein forming the oxide layer within the trench further comprises:

forming the oxide layer over the masking layer to fill the trench and extend to the surface of the masking layer;

using the masking layer as a stop layer, etching back the oxide layer until exposing the surface of the masking layer.

6. The method according to claim 1, wherein the masking layer is a silicon nitride layer.

7. The method according to claim 1, wherein etching back the oxide layer is performed by chemical mechanical polishing.

8. The method according to claim 1, wherein the oxide layer is removed by a wet etching process.

9. The method according to claim 8, wherein the wet etching process is applied with a phosphoric acid.

10. The method according to claim 1, wherein after removing the silicon oxide layer further comprises removing the pad oxide layer.

11. The method according to claim 10, wherein the pad oxide layer is removed by a wet etching process.

12. The method according to claim 11, wherein the wet etching process is applied with an HF solution.

* * * * *